(12) United States Patent
Bencher et al.

(10) Patent No.: US 7,365,014 B2
(45) Date of Patent: Apr. 29, 2008

(54) RETICLE FABRICATION USING A REMOVABLE HARD MASK

(75) Inventors: Christopher Dennis Bencher, San Jose, CA (US); Melvin Warren Montgomery, Camas, WA (US); Alexander Buxbaum, Portland, OR (US); Yung-Hee Yvette Lee, San Jose, CA (US); Jian Ding, San Jose, CA (US); Gilad Almogy, Kiriat Ono (IL); Wendy H. Yeh, Mountain View, CA (US)

(73) Assignee: Applied Materials, Inc., Santa Clara, CA (US)

(*) Notice: Subject to any disclaimer, the term of this patent is extended or adjusted under 35 U.S.C. 154(b) by 317 days.

(21) Appl. No.: 10/768,919

(22) Filed: Jan. 30, 2004

(65) Prior Publication Data

US 2005/0170655 A1    Aug. 4, 2005

(51) Int. Cl.
*H01L 21/66* (2006.01)
*H01L 21/311* (2006.01)
*H01L 21/302* (2006.01)
*H01L 21/44* (2006.01)
*H01L 21/461* (2006.01)

(52) U.S. Cl. ............... 438/700; 438/738; 438/680; 438/16

(58) Field of Classification Search ......... 438/700, 438/24, 29, 69, 308, 445, 551, 738, 16
See application file for complete search history.

(56) References Cited

U.S. PATENT DOCUMENTS

| | | | |
|---|---|---|---|
| 5,378,659 A | 1/1995 | Roman et al. | 438/761 |
| 6,060,132 A | 5/2000 | Lee | 427/579 |
| 6,171,764 B1 | 1/2001 | Ku et al. | 430/322 |
| 6,228,760 B1 | 5/2001 | Yu et al. | 438/636 |
| 6,291,361 B1* | 9/2001 | Hsia et al. | 438/738 |
| 6,391,794 B1 | 5/2002 | Chen et al. | 438/745 |
| 6,472,107 B1 | 10/2002 | Chan | 430/5 |
| 6,573,030 B1 | 6/2003 | Fairbairn et al. | 430/323 |

(Continued)

FOREIGN PATENT DOCUMENTS

EP    1011135    6/2000

OTHER PUBLICATIONS

C. Bencher et al., "Dielectric antireflective coatings for DUV lithography", Solid State Technology, pp. 109-114 (Mar. 1997).

(Continued)

*Primary Examiner*—Chuong Anh Luu
(74) *Attorney, Agent, or Firm*—Shirley L. Church

(57) ABSTRACT

We have reduced the critical dimension bias for reticle fabrication. Pattern transfer to the radiation-blocking layer of the reticle substrate essentially depends upon use of a hard mask to which the pattern is transferred from a photoresist. The photoresist pull back which occurs during pattern transfer to the hard mask is minimalized. In addition, a hard mask material having anti-reflective properties which are matched to the reflective characteristics of the radiation-blocking layer enables a reduction in critical dimension size and an improvement in the pattern feature integrity in the hard mask itself. An anti-reflective hard mask layer left on the radiation-blocking layer provides functionality when the reticle is used in a semiconductor device manufacturing process.

13 Claims, 4 Drawing Sheets

U.S. PATENT DOCUMENTS

| | | | |
|---|---|---|---|
| 6,589,717 B1 | 7/2003 | Ghandehari et al. | 430/322 |
| 6,607,984 B1 | 8/2003 | Lee et al. | 438/700 |
| 6,635,583 B2 | 10/2003 | Bencher et al. | 438/761 |
| 6,790,770 B2 * | 9/2004 | Chen et al. | 438/637 |
| 6,905,621 B2 * | 6/2005 | Ho et al. | 216/47 |
| 2002/0068229 A1 | 6/2002 | Westerman et al. | 430/5 |
| 2002/0197509 A1 | 12/2002 | Carcia et al. | 428/689 |
| 2003/0087518 A1 | 5/2003 | Chen et al. | 438/637 |
| 2003/0165747 A1 | 9/2003 | Magg | 430/5 |
| 2005/0221019 A1 * | 10/2005 | Baik et al. | 427/487 |

OTHER PUBLICATIONS

C. Gwyn et al., "Extreme Ultraviolet Scanning Lithography—Supports Extension of Moore's Law", Future Fab International, vol. 11, pp. 1-14 (Jun. 2001).

* cited by examiner

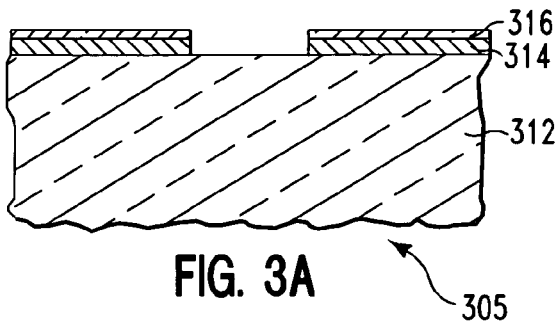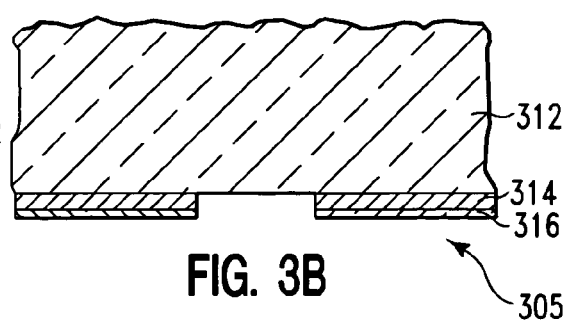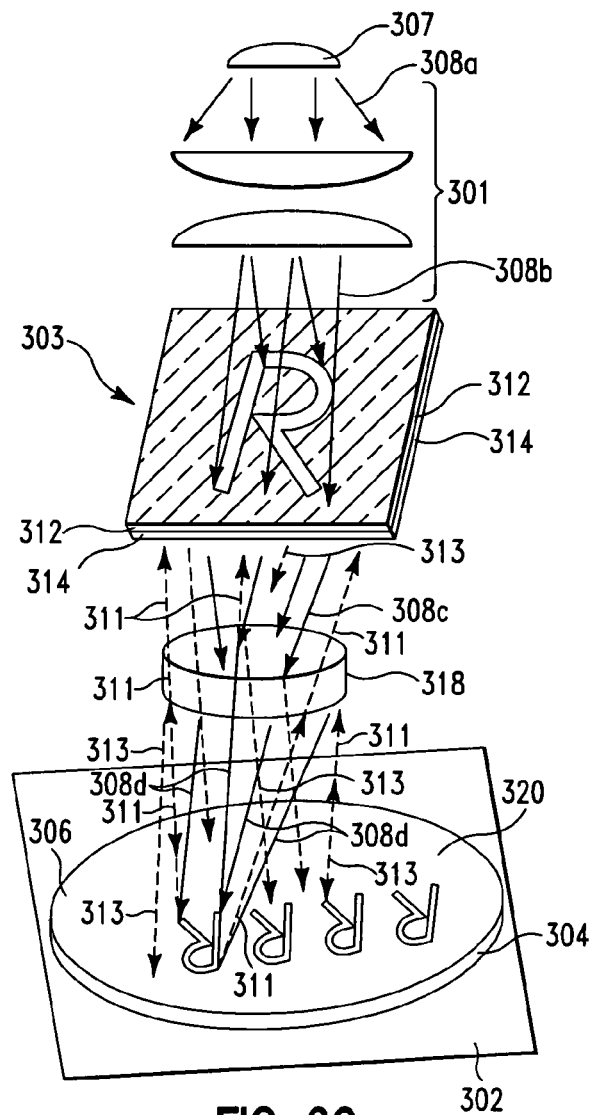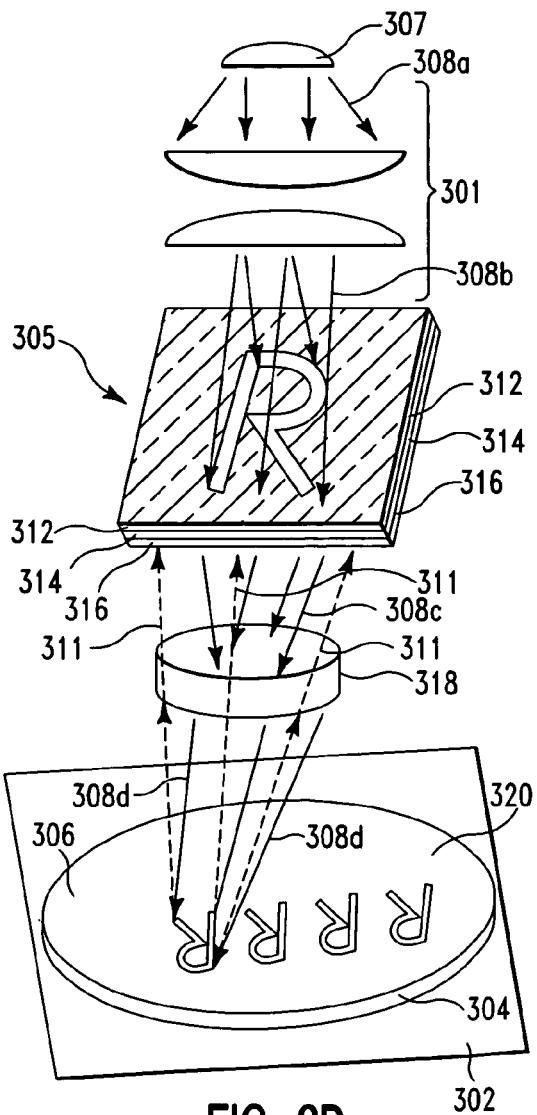

RETICLE FABRICATION USING A REMOVABLE HARD MASK

BACKGROUND OF THE INVENTION

1. Field of the Invention

The present invention relates to a method used to fabricate a reticle, which is also commonly referred to as a photomask. The reticle includes a patterned layer through which radiation passes during the transfer of the pattern from the reticle to a substrate via photolithographic techniques.

2. Description of the Background Art

A typical reticle fabrication process begins with the formation of a substrate which typically includes a silicon-containing base layer such as a quartz layer, with a layer of chrome applied over the quartz, and a layer of chrome oxide transitioning to chrome oxynitride which is formed over the chrome layer. A photoresist material is commonly applied over the chrome oxide/chrome oxynitride layer. The photoresist material is pattern imaged by irradiation, and the image in the photoresist is developed into a pattern. Then the patterned photoresist is used as a mask for transferring the pattern to the chrome layer. The pattern in the chrome layer permits radiation to pass through portions of the reticle when the reticle is used in the fabrication of a substrate, such as a semiconductor substrate, where the pattern is transferred via photolithography to the semiconductor substrate. The chrome oxide/chrome oxynitride layer of the reticle substrate functions as an anti-reflective coating (ARC) during patterning of the chrome layer. However, the anti-reflective properties of this layer are not as effective for present day photoresist imaging radiation as they were for imaging radiation which was used with earlier photoresists used in the art of reticle fabrication.

Reticles which are used in combination with a stepper of the kind used for semiconductor fabrication are generally 6 inch squares which are about 0.25 inches thick. Such reticles can be fabricated in most 8 inch or larger processing chambers of the kind which are used to fabricate semiconductor wafers. However, since the reticle is subsequently used in a manner where imaging radiation will come down through the top and out the bottom, there cannot be any significant scratches on either surface of the reticle through which the radiation will pass. As a result, the tool used for reticle fabrication requires specialized reticle substrate handling devices and contact surfaces. For example, a robot blade which moves the reticle substrate may hold it only by the edges or corners of the substrate and within a specific distance from the edge of the substrate. The pedestal upon which the reticle substrate sits is designed for minimal contact with the substrate, where a raised lip touches the edge of the reticle substrate or a few protrusions from the pedestal contact the reticle substrate.

Currently, during formation of the reticle substrate, the quartz base layer is polished on both major surfaces, followed by physical vapor deposition of a radiation-blocking layer such as a chrome layer over one of the major surfaces. Toward the end of the deposition of the chrome layer, oxygen is added to the deposition chamber so that a chrome oxide is formed; subsequently a small amount of nitrogen (referred to as a nitrogen bleed) is added to the deposition chamber as well, so that chrome oxide transitions to chrome oxynitride. As previously mentioned, the chrome oxide/chrome oxynitride layer functions to reduce reflectivity of the chrome surface during pattern imaging of a photoresist which is applied over the surface of the chrome oxide/chrome oxynitride layer. The amount of reflectivity depends on the imaging radiation.

One of the preferred direct write tools for imaging the photoresist is a continuous wave laser which writes at a wavelength of about 257 nm or 198 nm. This direct write tool is available under the trademark of ALTA™ from ETEC Systems, Inc., Hillsboro, Oreg. The reflectivity of the chrome oxide/chrome oxynitride layer is on the order of about 14% at 257 nm. This is much higher than desired and is an artifact from earlier techniques used to imaging the photoresist, where the imaging wavelength of the radiation was in the range of 405 nm and this worked in combination with the composition of the chrome oxide/chrome oxynitride layer to produce a reflectivity on the order of less than about 10%. To compensate for the present reflectivity problem during imaging of the photoresist with the radiation tools used today, an organic antireflective coating (ARC) may be applied over the surface of the chrome oxide/chrome oxynitride layer.

The chrome layer is typically patterned using a plasma dry etch technique where the plasma is generated from a source gas of chlorine and oxygen. This plasma etchant tends not to attack the quartz base of the substrate, which needs to remain transparent to radiation, so that the pattern in the chrome will be properly transferred during fabrication of a semiconductor wafer, for example but not by way of limitation. However, while the chlorine/oxygen plasma does not attack the quartz base of the reticle substrate, the oxygen present in the plasma does attack the photoresist which is being used to transfer the pattern to the chrome layer. This causes faceting of the photoresist, which is commonly referred to as "resist pull back", where the change in the critical dimension written into the photoresist is reflected in a change in the critical dimension of a pattern etched into the chrome. This is sometimes referred to as "CD loss". For example, based on a current test pattern where the nominal feature size pattern in the photoresist is about 720 nm, the feature size produced in the chrome may be 60 nm to 70 nm larger, principally due to resist pull back effects. If, for example, and not by way of limitation, the smallest space that can be written on a typical ARF (193 nm) photoresist using a 198 nm wavelength continuous wave laser is in the range of about 110 nm, then due to the resist pull back, the smallest chrome space which can be written may be in the range of about 170 nm to 180 nm. If, for example, and not by way of limitation, the smallest space that can be written on a typical ARF (193 nm) photoresist using an e-beam writing tool, available from Toshiba or Hitachi, for example, is about 90 nm, then due to the resist pull back, the smallest chrome space which can be written becomes about 150 nm to 160 nm. It is readily apparent that if this photoresist pull back problem can be eliminated, the smallest chrome feature which can be obtained is substantially improved.

The importance of eliminating the photoresist pull back problem is even more important when phase shifting reticles are considered. At present these reticles make up about 25% of reticles produced, but this percentage is increasing as feature dimension requirements go to smaller feature sizes. Phase shifting reticles are designed to neutralize diffraction components of the imaging radiation which affects the width of the space which can be written in the chrome. One of the preferred methods of phase shifting is accomplished using diffraction slits at particular locations in the chrome pattern. For a binary mask where the smallest space which can be written is 100 nm, for example, the phase shifting slit would preferably be in the range of 30 nm. However, since 30 nm cannot be written, the phase shift is limited to the threshold of what can be written. By eliminating the photoresist pull back (eliminating the CD bias which occurs because of the resist pull back), then the threshold for phase shifting can be lowered, and the feature resolution and integrity can be improved.

U.S. Pat. No. 6,171,764 to Ku et al., issued Jan. 9, 2001 describes the kinds of radiation reflection problems which may occur in photolithographic processes. The description relates to semiconductor manufacturing processes which make use of a dielectric anti-reflective (DARC) layer to reduce reflected radiation during photoresist imaging. In particular, the difference between the Ku et al. invention and other known methods is based on the ordering of specific layers in the substrate used in the photolithographic process. In the Ku et al. method, the DARC layer is applied over a substrate, followed by a hard mask layer, and then a photoresist. This is said to compare with other known methods where the DARC layer is used between the photoresist layer and the hard mask layer. (Col. 3, lines 35-46.)

U.S. Pat. No. 6,607,984 to Lee et al., issued Aug. 19, 2003 describes a method of semiconductor fabrication in which an inorganic anti-reflection coating is employed and subsequently removed by selective etching relative to an underlying inorganic dielectric layer. (Col. 1, lines 61-67, continuing at Col. 2 lines 1-6.)

European Patent Application No. 99204265.5 of Shao-Wen Hsia et al., published Jun. 21, 2000, describes a semiconductor interconnect structure employing an inorganic dielectric layer produced by plasma enhanced chemical vapor deposition (PECVD). In accordance with a preferred embodiment of the invention, a metal layer upon which photoresist patterns are developed comprises a sandwiched metal stack having a layer of conducting metal (aluminum, titanium, and the like) bounded by an upper thin-film ARC layer and a bottom thin-film barrier layer, where at least the top layer is composed of an inorganic dielectric substance. The use of an inorganic dielectric top ARC layer is said to facilitate the use of thinner photoresist layers while preserving the integrity of the photoresist pattern for deep sub-micron feature sizes. (Col. 1, lines 56-58, continuing at Col. 2, lines 1-8.)

All of the references described above pertain to the use of an ARC in the production of semiconductor devices. The production of semiconductor devices is typically carried out using exposure of a photoresist to blanket radiation through a reticle, to provide efficiency of production. The photoresist exposure time through a reticle is typically in the range of seconds to a few minutes. Applicants' invention pertains to a direct write of a pattern on a photoresist which is used to transfer a pattern to a reticle of the kind which is subsequently used in semiconductor production. This direct writing of a pattern on the photoresist takes hours, commonly between about 8 and about 20 hours. As a result of the time period required for patterning the photoresist which is used to fabricate the reticle (as well as possible differences in the photoresist material), chemical reactions may take place in the photoresist which affect the critical dimension of the patterned photoresist. Since the photoresists used for reticle fabrication are chemically amplified photoresists, and the time required for writing the pattern so long, the deflection of imaging radiation off the substrate underlying the photoresist becomes more critical than it is during fabrication of a semiconductor device, where photoresist patterning is carried out by blanket radiation through a reticle for a short time period.

There is currently a need for improvement in the functionality of the ARC used in reticle fabrication, so that a reduction in reflectivity is achieved for the radiation wavelengths currently used in the imaging of reticle fabrication photoresists. In addition, there is a need for a means of eliminating, or at least significantly reducing, the photoresist pull back during etching of the chrome layer (or other similar radiation blanking layer) to provide better control of the critical dimension of a patterned reticle.

SUMMARY OF THE INVENTION

We have reduced the critical dimension bias for reticle fabrication. Pattern transfer to the radiation-blocking layer of the reticle substrate essentially depends upon transfer from a hard mask rather than from a photoresist. The photoresist pull back which occurs during pattern transfer to the hard mask is minimal and the change in the critical dimension between the photoresist pattern and the hard mask pattern is typically less than about 10-12 nm. In addition, when the hard mask material has anti-reflective properties which are tailored to the imaging radiation wavelength, the reflectivity from the chrome surface is substantially reduced during imaging of the photoresist, which further reduces the change in critical dimension between the direct write pattern and the pattern transferred to the hard mask. When the selectivity during transfer of the pattern from the hard mask to the radiation-blocking layer is high, typically at least about 5:1 (where the radiation-blocking layer etches 5 times faster than the hard mask), this further reduces the critical dimension bias (typically referred to as etch bias) in the pattern transferred to the chrome (or other radiation-blocking layer). The highest selectivity for the radiation-blocking layer relative to the hard mask, which can be obtained while meeting other requirements for the hard mask, is advantageous. A combination of the above-described process considerations enables a reduction in critical dimension size of the patterned radiation-blocking layer and provides an improvement in the pattern feature integrity of the patterned radiation-blocking layer. A typical increase in critical dimension from the size of the direct write pattern radiation to the patterned radiation-blocking layer may be in the range of about 5% to 7% or less.

In one embodiment of the invention, a hard mask material having anti-reflective properties may be left on the surface of the chrome after etching of the chrome. Since the hard mask surface faces the surface of a photoresist on the semiconductor substrate which is patterned using the reticle, the presence of the proper anti-reflective properties in the hard mask can be used to reduce the amount of bounce-back of reflected radiation which occurs during blanket radiation imaging of the semiconductor photoresist through the reticle. By bounce back reflected radiation, it is meant the radiation which reflects off the semiconductor substrate to the reticle or to other surfaces (between the reticle and the semiconductor substrate) and then back to the semiconductor substrate photoresist.

In another embodiment of the invention, where a wet etch is used during fabrication of the reticle, the hard mask material (whether having anti-reflective properties or not) is removed to prevent contamination during the wet etch process. In this embodiment, when a plasma etchant used to remove the hard mask would also etch the reticle base substrate (which is typically quartz), a protective layer is applied to fill at least a portion of patterned openings through the chrome during removal of the hard mask. This prevents etching of the quartz at the bottom of the pattern openings during removal of the hard mask.

BRIEF DESCRIPTION OF THE DRAWINGS

FIG. 3A shows a schematic cross-sectional view of a reticle structure including a quartz substrate 312, underlying a patterned chrome-containing radiation-blocking layer 314, with an inorganic layer having anti-reflective properties 316 on the surface of the patterned radiation-blocking layer 314.

FIG. 3B shows the reticle structure of FIG. 3A inverted into the position of use in a lithographic stepper.

FIG. 3C shows a schematic cross-sectional view of a reticle structure 303 which does not have an inorganic layer which exhibits anti-reflective properties 316 on the surface of radiation-blocking layer 314. This provides a comparative example where the final patterning radiation 308d can bounce radiation 311 off the surface 306 of a photoresist 320 present on the surface of a semiconductor wafer 304. The bounced radiation 311 can reflect off the reticle 303 surface, and produce bounce-back radiation 313 on the surface 306 of photoresist 320.

FIG. 3D shows a schematic cross-sectional view of a reticle structure 305, of the kind shown in FIGS. 3A and 3B, which does have an inorganic layer 316 exhibiting anti-reflective properties on the surface of radiation-blocking layer 314. Final patterning radiation 308d which produces bounced radiation 311, is not reflected back to the surface 306 of photoresist 320, because a large portion of the bounced radiation 311 is consumed by the inorganic anti-reflective layer 316.

DETAILED DESCRIPTION OF EXEMPLARY EMBODIMENTS

Figure 1A:
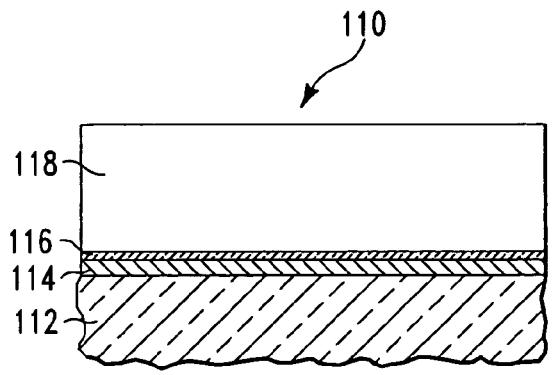
FIGS. 1A through 1C show schematic cross-sectional views of three typical structures which have been used as a reticle substrate prior to patterning.

As a preface to the detailed description, it should be noted that, as used in this specification and the appended claims, the singular forms "a", "an", and "the" include plural referents, unless the context clearly dictates otherwise.

In order to obtain patterned reticle structures with smaller sized critical dimensions, we have developed a method of reducing the effect of faceting and pull-back of a photoresist used to pattern the structure. In addition, we have reduced the amount of reflection of imaging radiation off the radiation-blocking layer of the reticle structure during direct writing of the pattern onto the photoresist, which further reduces the change in critical dimension between the direct write pattern and the pattern transferred to the hard mask. When the selectivity during transfer of the pattern from the hard mask to the radiation-blocking layer is high, typically at least about 5:1 (where the radiation-blocking layer etches 5 times faster than the hard mask), this further reduces the critical dimension bias (typically referred to as etch bias) in the pattern transferred to the chrome (or other radiation-blocking layer). A combination of the above-described process considerations enables a reduction in critical dimension size of the patterned radiation-blocking layer and provides an improvement in the pattern feature integrity of the patterned radiation-blocking layer. Further, we have created a reticle structure which can be adjusted to reduce bounced-back, reflected photons off the semiconductor photoresist surface during semiconductor fabrication.

As mentioned in the Background Art section above, reflections of optical imaging radiation from underlying materials during direct writing of a pattern on the photoresist used to transfer the pattern to the radiation-blocking layer of the reticle frequently creates problems during the fabrication of a reticle. Standing waves may be created in an optically imaged photoresist. The presence of defects in the exterior shape of the developed photoresist affect the critical dimensions of the reticle pattern, and in particular the resolution of dimensions of the reticle pattern when feature dimensions are in the range of 100 nm and smaller. It follows that the critical dimensions of the semiconductor structure fabricated using the reticle are thereby affected.

As previously mentioned, the reticle substrate can be prepared using apparatus of the kind known in the semiconductor industry for deposition of layers of various materials and for removal of portions of deposited layers, for example but not by way of limitation.

All processes for patterning a reticle (photomask) can benefit from application of the present method in terms of the critical dimension size and pattern integrity which can be achieved in the patterned radiation-blocking layer of the mask, such as a chrome layer. A reticle with a residual layer of an anti-reflective material (which served as a hard mask during etching of the radiation-blocking layer) is particularly useful when the reticle is used in combination with an optical exposure tool during the fabrication of semiconductor devices. With this in mind, the invention is described with reference to use of a continuous wave direct write laser as the radiation fool and with reference to a chemically amplified DUV photoresist. However, as previously mentioned, the benefit of the invention in terms of critical dimension size of features etched in the radiation-blocking layer of the reticle is also applicable to a direct-write e-beam radiation tool of the kind available from Hitachi and Toshiba for the fabrication of reticles.

In the embodiments of the invention described below, the imaging of the photoresist material during fabrication of the reticle was carried out using a direct write continuous wave laser, in particular, a 257 nm or 198 nm continuous wave laser direct writing tool available from ETEC Systems, Inc., Hillsboro, Oreg. The direct write continuous wave laser writes, via exposure to optical radiation, a pattern image such as an integrated circuit pattern, for example and not by way of limitation, onto an unpatterned photoresist coated on the reticle substrate. The reticle substrate includes a combination of specific layers of the kind described subsequently herein. The exposed photoresist then contains a latent image of the pattern, which is subsequently "developed", to produce a patterned photoresist. The patterned photoresist is then used to transfer the pattern through underlying layers of the reticle substrate, to create a patterned reticle. The pattern is typically transferred from the photoresist to underlying reticle substrate layers by dry plasma etch techniques, but in some instances a wet etch may be used in combination with the dry etch to achieve particular etched shapes.

Realization of the desired control over critical dimension (CD) of the patterned features in the radiation-blocking layer of the reticle depend on a combination of the particular radiation tool which is used and the composition of the various layers in the reticle substrate. The present invention relates to the selection of and use of the various layers in the reticle substrate, to provide a smaller dimension CD with improved pattern integrity across the reticle for a given radiation tool.

Since the reticle fabrication processes of particular interest with respect to the present invention require the use of a direct write process for irradiating the photoresist, it is important that the photoresist selected be one which will provide dimensional stability for the latent image written into the photoresist, both during the writing of the image, and during the time necessary for development of the image to provide a patterned photoresist. The latent image stability in the photoresist should be such that there is less than a 5 nm change in the CD during this time period which is typically about 6 hours and may extend out to as long as about 20 hours, or longer.

The substrate material used for the reticle is typically selected from the group of materials including quartz, fluorinated quartz, borosilicate glass, soda lime glass, and combinations thereof. In the embodiments described herein, the substrate used for reticle fabrication was quartz, which met the requirements shown in Table I below.

TABLE I

QUARTZ PROPERTIES

| Physical Property | | Condition | Quartz Mask Blank |
|---|---|---|---|
| Composition | | | 100% $SiO_2$ |
| Thermal | Expansion | Coefficient ($\alpha_{50}$ −200° C. × $10^{-7}$) | 5 |
| Thermal | Annealing Point | | 1,120° C. |
| Optical Properties | Refractive Index | | 1.46 $n_d$ |
| Chemical Durabilities | Weight Loss | Deionized (DI) water, 100° C., 1 hour | 0.000% |
| | | 1/100N $HNO_3$, 100° C., 1 hour | 0.000% |
| | | 5% NaOH, 80° C., 1 hour | 0.17 mg/$mm^2$ |

In addition, the quartz substrate had the following physical properties: a Young modulus of 7.413 kg/$mm^2$; a sheer modulus of 3,170 kg/$mm^2$; a Poisson ratio of 0.18; a Knoop hardness of 615 kg/$mm^2$; and a Lapping hardness of 210 kg/$mm^2$. The electrical properties included a surface resistivity of $1 \times 10^{19}$ Ω/square and bulk resistivity of $1 \times 10^{18}$ Ω/square.

The hard masking material layer may be selected from any of the materials used in the semiconductor industry as hard masks during a plasma etch process. In some instances, the hard masking material may have anti-reflective characteristics. In other instances, it may be desirable to use a dual layer hard mask, where one layer has no anti-reflective properties and one layer has anti-reflective properties. In considering the selection of a hard masking material, the material may need to be able to withstand both a plasma dry etch process and a wet etch process, when a phase shifting reticle is being fabricated; or the hard mask may have to be removed subsequent to dry etch of at least a portion of the radiation-blocking layer and prior to wet etching.

Typical examples of hard masking materials which provide anti-reflective properties, not by way of limitation, include chrome oxynitride, silicon oxynitride, silicon-rich oxide, silicon-rich nitride, silicon-rich oxy-nitride, titanium nitride, molybdenum silicide, and silicon carbide, including: SiC; SiC: H; SiC: O, H; SiC: N, H; and SiC: O, N, H. Plasma etch selectivity for etching the radiation-blocking material relative to the anti-reflective hard masking material should be at least about 5:1 or greater. The anti-reflective properties of the hard mask need to be tailored to protect the particular photoresist in view of the imaging radiation which is being used. By way of example, and not by way of limitation, the chemically amplified photoresists which are typically used for feature sizes of about 150 nm and less incorporate binder polymers such as methacrylate-containing resins, hydroxyphenyl-based resins, aromatic acrylic-based resins and isobornyl-based resins.

Typical examples of hard masking materials which do not provide anti-reflective properties include, not by way of limitation, diamond-like carbon, carbon, tungsten, $SiO_2$, and $Si_3N_4$. These materials are deposited over the radiation-blocking layer of material using techniques known in the art, provided the temperature of the substrate does not rise above about 450° C. during deposition. The hard masking material selected will depend on the radiation-blocking material into which the pattern is to be transferred from the hard mask. Again, the plasma etch selectivity for etching the radiation-blocking material layer relative to the hard mask material layer should provide an etch rate for radiation-blocking material layer which is at least about 5 times the etch rate for the hard mask material, i.e., the selectivity for etching the radiation-blocking material should be at least 5:1, and typically is in the range of about 8:1, although a selectivity of 50:1 has been achieved, and higher selectivities may be possible.

EXAMPLE EMBODIMENTS

Example One

Comparative Example Reticle Starting Structures

FIG. 1A shows a schematic cross-sectional view of a reticle starting structure 110 of one kind used in the fabrication of a reticle. In this comparative Example, starting structure 110 was a stack of layers (not shown to scale) which included, from top to bottom, a 5,000 Å thick layer 118 of a chemically amplified DUV photoresist, DX1100 (available from AZ Clariant Corp. of Somerville, N.J.); an approximately 200 Å thick layer 116 of chrome oxide transitioning to chrome oxynitride; a 750 Å thick layer 114 of chrome radiation-blocking material; and a silicon oxide-containing substrate 112 which was quartz in this instance.

Figure 1B:
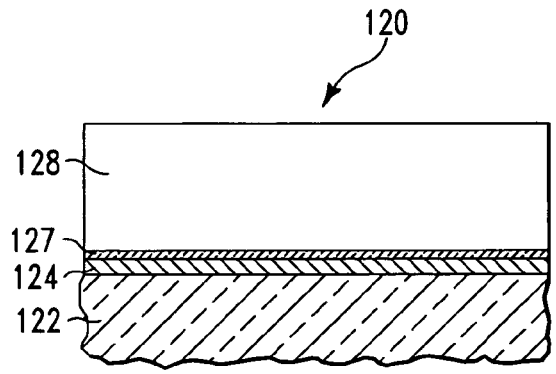

FIG. 1B shows a schematic cross-sectional view of another reticle starting structure 120 of the kind used in the fabrication of a reticle. In this Example, starting structure 120 was a stack of layers (not shown to scale) which included, from top to bottom, a 5,000 Å thick layer 128 of the chemically amplified DUV photoresist, DX1100; a 470 Å thick layer 127 of an organic ARC identified as KRF 17G (available from AZ/Clariant); a 750 Å thick layer 124 of chrome mask material; and a silicon oxide-containing substrate 122, which was quartz. The organic ARC layer 127 was used both as an antireflective coating and to minimize a chemical reaction which occurs in some instances when there is direct contact between a chrome oxide and the photoresist.

Figure 1C:
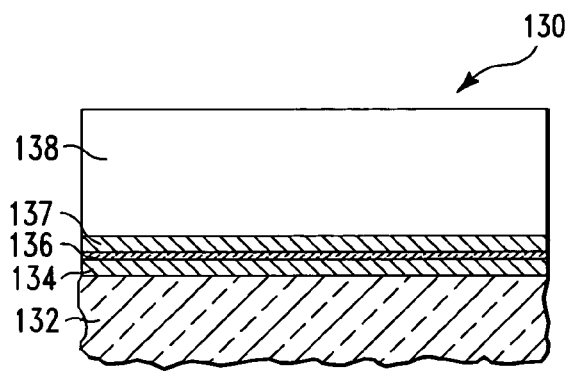

FIG. 1C shows a schematic cross-sectional view of a third reticle starting structure 130 of the kind used in the fabrication of a reticle. In this comparative example, the starting structure was a stack of layers (not shown to scale) which included, from top to bottom, a 5,000 Å thick layer 138 of the chemically amplified DUV photoresist, DX1100; a 470 Å thick layer of the organic ARC 137 identified as KRF 17G; a 250 Å thick layer of chromium oxide transitioning to chromium oxynitride (inorganic ARC) 136; a 750 Å thick layer 134 of chrome mask material; and a silicon oxide-containing substrate 132 which was quartz.

All of the example reticle starting structures illustrated in FIGS. 1A through 1C suffer from the same problem. They all rely on the photoresist as the masking material for etching of the chrome mask material. As a result, the thickness of the photoresist layer is 5,000 Å, and there is resist pull back which occurs as etching of the chrome progresses, causing a problem in all of these instances. This problem is illustrated in FIGS. 1D and 1E, using the FIG. 1A reticle starting structure in the illustrations.

Figure 1D:
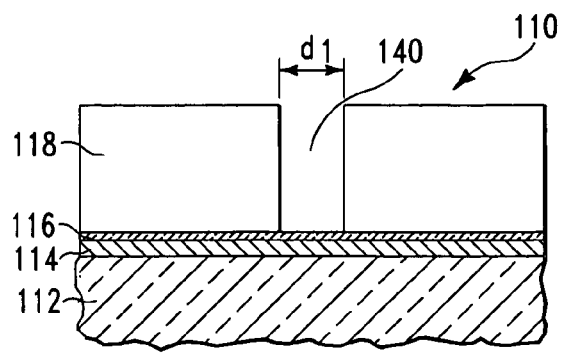
FIGS. 1D and 1E are also schematic cross-sectional views, which illustrate process steps leading to photoresist pull back. The photoresist pull back commonly occurs during etching of a chrome (or other radiation-blocking layer) on a reticle substrate, when the structure of the substrate is one of the kind shown in FIGS. 1A through 1C.
Figure 1E:
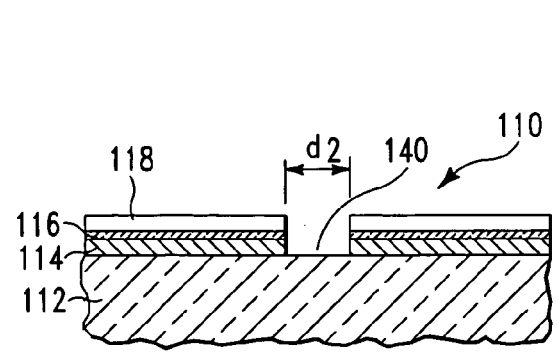

FIG. 1D shows the reticle starting structure of FIG. 1A after the photoresist 118 has been exposed to the direct write radiation and then developed using the liquid developer recommended by the photoresist manufacturer. The opening 140 through photomask 118 has a critical dimension $d_1$, which could be the width of a trench or the diameter of a contact via, for example. In this instance, the width of the test pattern which was etched was 720 nm. After transferring the opening 140 through the underlying layer of chrome oxide/chrome oxynitride, the width $d_2$ of opening 140, as illustrated in FIG. 1E was approximately 780 nm to 790 nm. The increase in $d_2$ over $d_1$ may be about 60 nm to 70 nm.

As discussed in the Background Art section of the present disclosure, as the critical dimensions of the patterns in the reticle have become smaller, the effect on the width of the critical dimension caused by photoresist pull back has become a very significant problem.

Example Two

Avoiding the Photoresist Pull Back Problem

FIGS. 2A through 2D illustrate the general concept which permits pattern etching of the radiation-blocking layer of a reticle without photoresist pull back, and thus without the resulting CD bias problems. FIGS. 2A through 2D show schematic cross-sectional views of a reticle fabrication process beginning with a starting structure and ending with the patterned reticle.

Figure 2A:
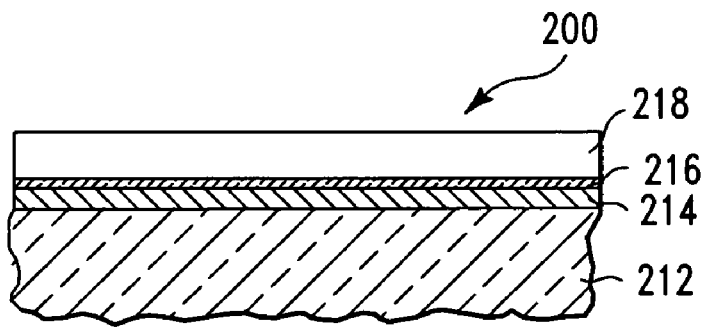
FIG. 2A shows a schematic cross-sectional view of an improved reticle fabrication starting structure which is one of the embodiments of applicants' invention.

FIG. 2A shows the reticle starting structure 200 which consists of, from top to bottom, a chemically amplified photoresist layer 218 of the kind described with reference to FIGS. 1A through 1C; the thickness of the photoresist layer 218 was about 3,000 Å to about 4,000 Å. Underlying photoresist layer 218 was a layer of inorganic ARC, $Si_xO_yN_z$ 216 which was selected to function as a plasma etching hard mask having anti-reflective properties. The thickness of the $Si_xO_yN_z$ hard mask layer 216 ranged from about 200 Å to about 500 Å, and was typically about 300 Å. Underlying the $Si_xO_yN_z$ hard mask layer 216 was a layer of chrome 214 having a thickness of about 750 Å which resided on the surface of a quartz substrate 212.

Figure 2B:
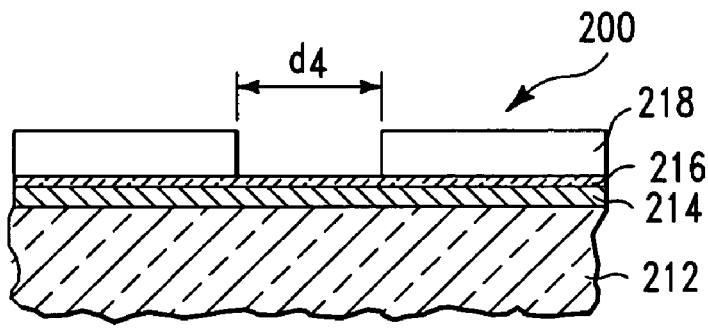
FIGS. 2B through 2D are schematic cross-sectional views which illustrate how chrome pull back (an increase in the opening through the chrome) is substantially reduced, typically by more than 50% to 70%, using the reticle substrate structure shown in FIG. 2A as compared with the reticle substrate structure shown in FIG. 1A.

FIG. 2B shows the reticle starting structure of 2A after imaging and development to produce an opening having a critical dimension $d_4$, which may be the width of a trench or the diameter of a contact via to be transferred to a semiconductor substrate during use of the reticle, by way of example and not by way of limitation.

In this particular embodiment, the photoresist was UV6, a chemically amplified photoresist available from Shipley Company, or was FEP 171, a chemically amplified photoresist available from Hoya. The radiation source used to image the photoresist was an ALTA 4300, 257 nm continuous wave laser direct writing tool, available from ETEC Systems, Inc. Hillsboro, Oreg. The composition of the $Si_xO_yN_z$ hard mask layer 216 was such that x ranged from about 0.45 to about 0.55; y ranged from about 0.2 to about 0.3; and z ranged from about 0.2 to about 0.3 (excluding hydrogen). This particular composition provided an n which ranged from about 1.95 to about 2.1, and a k at 248 nm which ranged from about 0.3 to about 0.6, so that a thickness of at least 200 Å ensured that radiation from the 257 nm continuous wave laser which was reflected off the underlying chrome layer would not pass through the $Si_xO_yN_z$ hard mask layer to the overlying photoresist layer. In addition, since the chrome layer to be etched was about 750 Å thick and the selectivity for the $Si_xO_yN_z$ hard mask layer relative to the chrome layer was greater than about 7.5:1, the required minimal thickness for the hard mask layer to enable etching through the chrome layer ranged from about 100 Å on the smallest areas to about 200 Å on the corners. After considering both of these requirements, the thickness of the $Si_xO_yN_z$ hard mask layer was set at 300 Å, allowing for a factor of safety. Although the photoresist used in the present embodiment was FEP 171 available from Hoya, or UV6 available from Shipley Company, other similar chemically amplified photoresists such as REAP 122 from TOK, or PEK 130 from Sumitomo/Sumika, or DX1100P from Clariant might have been used, by way of example, and not by way of limitation. It is advisable to match the nm wave length of the imaging radiation as closely as possible with the nm wave length the photoresist was designed to work with.

After imaging of the photoresist, the photoresist was developed in the manner recommended by the manufacturer of the photoresist. The critical dimension $d_4$ was the test pattern dimension in the range of about 720 nm.

In the case when there is a chrome-oxynitride ARC layer present beneath the $Si_xO_yN_z$ ARC layer, then the $Si_xO_yN_z$ ARC layer should be tuned closer to a k=0.3 at the 257 nm exposure wavelength. This is achieved by reducing (x) to the lower limit around 0.4-0.45. In the case of chrome without a chrome oxynitride ARC surface layer, the $Si_xO_yN_z$ should be tuned closer to a k=0.5 to 0.6 at the exposure wavelength. This is achieved by increasing (x) to the upper limit around 0.5 up to 0.6.

Silicon oxynitride can not be used as an electron beam ARC. For an e-beam ARC, a conducting layer such as α-Si or α-C should be used.

The $Si_xO_yN_z$ ARC/hard mask layer was deposited using plasma enhanced chemical vapor deposition (PECVD). The PECVD was carried out in a parallel plate capacitively coupled plasma processing apparatus. The precursors for the PECVD were $SiH_4$, $N_2O$, and He, which were used in the proportions shown in Table II, below, depending on the desired values of x, y, and z. The pressure in the CVD chamber ranged from about 3 Torr to about 9 Torr, with good results obtained at 5 Torr. For this process chamber, the overall flow rate of the reactant gases ranged from about 4,000 sccm to about 4,300 sccm, with specific amounts of each gas shown in Table II below. The plasma source power ranged from about 0.25 W/cm² to about 1 W/cm², where the cm² refers to the surface area of the reticle substrate upon which the hard mask layer was deposited. No biasing power was applied to the substrate. The temperature of the cathode (support pedestal) underlying the reticle substrate ranged from about 250° C. to about 400° C., with a resulting reticle temperature being in the range of about 210° C. to about 360° C. Operation of the PECVD deposition process at lower temperatures results in a reduction in the selectivity of the $Si_xO_yN_z$ layer relative to the radiation-blocking layer. With respect to a chrome radiation-blocking layer, a 400° C. cathode temperature did not appear to affect the underlying chrome. No roughness of the etched chrome line appeared after etch, which roughness would have been attributed to crystallization or grain growth or similar change in the chrome due to exposure to the temperature used during PECVD deposition of the $Si_xO_yN_z$ layer.

TABLE II

PROCESS CONDITIONS FOR PECVD $Si_xO_yN_z$

| Process Condition | General Range | Preferred Range | Currently Best Known Range |
|---|---|---|---|
| Total Gas Flow (sccm) | 4190 ± 50% | 4190 ± 20% | 4190 ± 10% |
| SiH₄ (sccm) | 110 ± 50% | 110 ± 10% | 110 ± 10% |
| N₂O (sccm) | 280 ± 50% | 280 ± 50% | 280 ± 10% |
| Helium (sccm) | 3,800 ± 50% | 3,800 ± 50% | 3,800 ± 10% |
| Substrate Temperature (° C.) | 150 to 450 | 250 to 425 | 350 to 400 |
| Process Chamber Temperature (° C.) | 150 to 450 | 250 to 425 | 350 to 400 |
| Process Chamber Pressure (Torr) | 5 ± 50% | 5 ± 20% | 5 ± 10% |
| Source Power (W/cm²) | 0.4 ± 100% | 0.4 ± 25% | 0.4 ± 10% |

The spacing between the substrate upper surface and the face plate in the 8 inch wafer PECVD chamber used for film deposition was about 350 mils (8.9 mm) to 400 mils (10.2 mm).
The processing conditions described above were designed to provide a $Si_xO_yN_z$ film having a refractive index, n, at exposure λ (257 nm) in the range of about 2.0 ± 30%, and typically about 2.0 ± 20%, with the thickness of the film layer ranging from about 100 Å to 1,000 Å, and typically about 250 Å to about 300 Å for use in combination with the underlying chrome layer, in accordance with the relationship between the optical properties (n, k, and d) required for total phase-shift cancellation, where n is the refractive index, k is the extinction coefficient, and d is the thickness of the film.
The processing conditions described above were designed to provide a $Si_xO_yN_z$ film having an extinction coefficient, k, at exposure λ (257 nm) in the range of about 0.4 ± 50%, and typically 0.4 ± 20%, with the thickness of the film layer ranging from 100 Å to 1,000 Å, and typically about 250 Å to about 300 Å for use in combination with the underlying chrome layer.

Figure 2C:
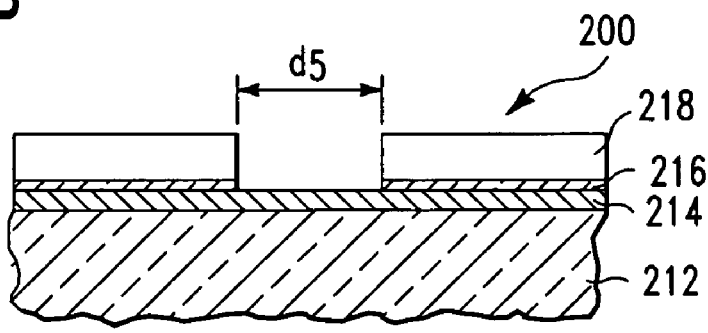

As illustrated in FIG. 2C, subsequent to patterning of the FEP 171 photoresist 218, the photoresist was used to transfer the pattern through the underlying $Si_xO_yN_z$ hard mask layer 216 using a plasma etch process, where the plasma source gas used to generate the etchant plasma consisted essentially of $CF_4$ and $CHF_3$, or consisted essentially of $SF_6$ and helium. Either of these source gases provided good results. When the $CF_4/CHF_3$ plasma source gas was used, typically the volumetric ratio of $CF_4$ to $CHF_3$ ranged from about 1:10 to about 2:1, with good results achieved at about 1:3. When the $SF_6$ and helium plasma source gas was used, the volumetric ratio of $SF_6$ to helium was about 0.02:1 to about 0.05:1, with good results achieved at about 0.033:1. The pressure in the etch chamber typically ranged from about 1 mTorr to about 10 mTorr, with good results achieved at about 3 mTorr for the $CF_4/CHF_3$ plasma and at about 5 mTorr for the $SF_6$/helium plasma. The etch process was carried out in a TETRA II® etch chamber, which is a DPS™ etch chamber available from Applied Materials, Inc. of Santa Clara, Calif.

In this etch chamber, the plasma source gas flow rate ranged from about 20 to about 100 sccm, and was typically about 40 sccm. The plasma source power applied ranged from about 200 W to about 700 W, with good results being achieved at about 250 W. The plasma density in the etch chamber ranged from about $1\times10^{11}$ to about $1\times10^{12}$, i.e. a high density plasma was used. The reticle substrate was biased at a bias power ranging from about 10 W to about 200 W. For the $CF_4/CHF_3$ plasma source gas etch chemistry, a bias power of about 70 W provided good results. For the $SF_6$/helium plasma source gas etch chemistry, a bias power of about 50 W provided good results. The temperature of the cathode beneath the reticle substrate was typically about 20° C., and the chamber wall temperature was typically about 65° C.

The substrate rested on an anodized aluminum surface of the biased cathode and was held in place by gravity. A capture ring surrounded the substrate and helped prevent plasma etchant from reaching the backside of the reticle substrate. A DPS™ etch chamber, like the TETRA II® etch chamber, permits separate power application for plasma generation and for substrate biasing (which is commonly referred to as a Decoupled Plasma Source (DPS)). Separate application of power for plasma generation and power for substrate biasing permits separate control of the plasma density and the attractive forces (DC voltage) generated on the surface of the substrate.

The $Si_xO_yN_z$ hard mask 216 was etched through providing a critical dimension $d_5$ of about 733 nm, providing a difference between the $d_4$ critical dimension of the photoresist and $d_5$ critical dimension of the $Si_xO_yN_z$ hard mask of only about 13 nm. The residual portion of photoresist layer 218 which remains after etching through the $Si_xO_yN_z$ hard mask 216 may be removed prior to etching of the chrome layer 214 if the photoresist material tends to deform during etching of the chrome layer 214. However, if the photoresist used does not deform in a manner which affects the etch profile of the opening etched into the chrome layer 214, it may be advantageous to leave residual photoresist layer 218 in place, to be consumed during the etching of chrome layer 214, as this helps reduce the effect of any "pin holes" (not shown) in the $Si_xO_yN_z$ hard mask 216, due to the initial thickness of hard mask 216 typically being less than about 400 Å.

Figure 2D:
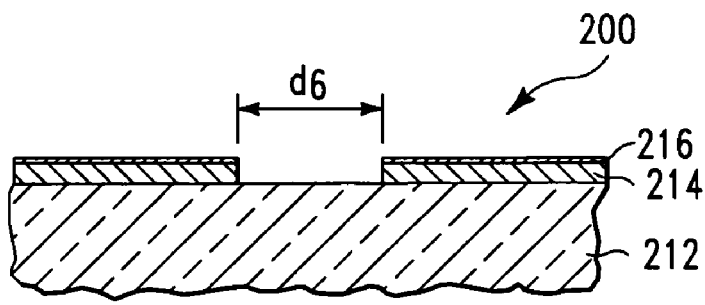

FIG. 2D illustrates the reticle after plasma etch through chrome layer 214. The chrome was etched in the same etch process chamber as described above with reference to etching the $Si_xO_yN_z$ hard mask. The plasma source gas used for generation of the plasma etchant was chlorine in the form of $Cl_2$ and oxygen in the form of $O_2$. Other gases which are inert may be added to the plasma source gas, such as helium, neon, argon, and krypton, by way of example and not by way of limitation. When a $Cl_2/O_2$ plasma source gas was used, typically the volumetric ratio of $Cl_2$ to $O_2$ ranged from about 20:1 to about 1:1.2, with good results achieved at about 10:1. When helium was added as an inert gas, the volumetric ratio of helium relative to oxygen ranged from about 15:1 to about 1.2:1. The pressure in the etch chamber typically ranged from about 3 mTorr to about 10 mTorr, with good results achieved at about 4 mTorr.

In the TETRA II® etch chamber, the overall plasma source gas flow rate ranged from about 100 to about 500 sccm, and was typically about 400 sccm. The plasma source power applied ranged from about 300 W to about 600 W, with good results being achieved at about 350 W. The plasma density in the etch chamber ranged from about $1\times10^{11}$ e$^-$/cm$^2$ to about $1\times10^{12}$ e$^-$/cm$^2$, i.e. a high density plasma was use The reticle substrate was biased at a bias power ranging from about 0 W to about 200 W. For the $Cl_2/O_2$ plasma source gas etch chemistry, a bias power of about 15 W provided good results. The temperature of the cathode beneath the reticle substrate was typically about 20° C., and the chamber wall temperature was typically about 65° C.

The chrome radiation-blocking layer was etched through providing a critical dimension $d_6$ of about 760 nm, and the difference between the $d_4$ critical dimension of the photoresist and $d_6$ critical dimension of the patterned chrome radiation-blocking layer was only about 40 nm, compared with the 60 nm to 70 nm which was observed when the chrome was etched using a photoresist mask. This significant improvement in the etch bias between the developed photoresist critical dimension and the patterned radiation-blocking layer critical dimension enables the production of a reticle having smaller feature sizes. Although the test pattern etched here was a 720 nm test pattern, a similar proportional improvement in etch bias is expected to occur for the smaller pattern features, in the 110 nm range, for example.

When the hard mask used to pattern the chrome layer is a material such as diamond-like carbon, the plasma source gas used to generate the plasma for etching the diamond-like carbon material may be oxygen and helium, for example. Typically, the volumetric ratio of oxygen to helium ranges from about 1:1 to about 1:10. The pressure in the etch chamber commonly ranges from about 3 mTorr to about 15 mTorr, with good results achieved at about 8 mTorr in a TETRA® II etch chamber. A plasma source gas flow rate of about 20 sccm to about 100 sccm is used, with a typical flow rate being about 40 sccm. The plasma source power applied is about 200 W to about 700 W. The plasma density in the chamber ranges from about $1\times10^{11}$ e$^-$/cm$^2$ to about $1\times10^{12}$ e$^-$/cm$^2$. The reticle substrate is biased at a bias power of about 20 W to about 70 W. The temperature of the cathode beneath the reticle substrate is typically about 20° C., and the chamber wall temperature is typically about 65° C.

Example Three

Advantage of a Reticle Having an ARC over the Patterned Radiation-Blocking Layer FIGS. 3A through 3D illustrate schematic cross-sectional views which show the advantages of a reticle structure where a hard mask having antireflective properties is present over the surface of a patterned chrome-containing layer (or other radiation-blocking layer) during imaging of a photoresist on a semiconductor wafer using the reticle. This feature is helpful when imaging of the photoresist is with optical radiation.

FIG. 3A shows a schematic cross-sectional view of a reticle structure 305 including, from bottom to top, a quartz substrate 312, underlying a patterned chrome-containing radiation-blocking layer 314, with an inorganic layer having anti-reflective properties 316 present on the upper surface of the patterned radiation-blocking layer 314. This structure is of the kind shown in FIG. 3D above, the fabrication of which is described in detail with reference to FIG. 3D.

FIG. 3B shows the reticle structure of FIG. 3A inverted into the position in which it is used in a lithographic stepper, for way of example, and not by way of limitation with respect to the lithographic exposure tool.

FIG. 3C shows a schematic cross-sectional view of a reticle structure 303 which does not have an inorganic layer which exhibits anti-reflective properties 316 on the surface of radiation-blocking layer 314. The radiation source 307 produces initial radiation 308a, which passes through a condenser 301 and provides imaging radiation 308b. The imaging radiation 308b passes through reticle structure 303 and provides patterned imaging radiation 308c. The patterned imaging radiation 308c passes through a reduction lense 318 to produce the final patterning radiation 308d which reaches the surface 306 of photoresist 320. Final patterning radiation 308d can bounce radiation 311 off the surface 306 of photoresist 320 present on a semiconductor wafer 304, supported by pedestal 302. The bounced radiation 311 can reflect off the reticle 303 surface, and produce bounce-back radiation 313 on the surface 306 of photoresist 320.

FIG. 3D shows a schematic cross-sectional view of a reticle structure 305, of the kind shown in FIGS. 3A and 3B, which does have an inorganic layer with anti-reflective properties 316 on the surface of radiation-blocking layer 314. Final patterned radiation 308 which passed through reticle structure 305 which bounces back to the inorganic layer 316 which has anti-reflective properties is not reflected back to the surface 306 of the photoresist 320. This enables a better defined image in the photoresist 320 and improves the uniformity of the image in the photoresist 320 across the semiconductor wafer 304.

Example Four

Removal of Inorganic Hard Mask or ARC From the Surface of the Radiation-Blocking Layer There are instances when it is desired to remove residual hard mask layer or ARC layer from the surface of the patterned radiation-blocking layer of the reticle without harming the basic substrate of the reticle (the quartz or borosilicate glass, or soda lime glass, for example). If the residual hard mask layer or residual inorganic ARC/hard mask layer contains a material which is common to the basic substrate material, then removal of the hard mask layer or ARC/hard mask layer is problematic. An example of this would be the removal of a silicon oxynitride ARC/hard mask layer when the base substrate layer of the reticle which is exposed through a patterned radiation-blocking layer contains silicon, i.e. is quartz.

Removal of residue of such an ARC/hard mask layer may be necessary when the reticle is a phase shifting reticle. There are generally two kinds of phase shifting reticles. A first kind is referred to as an attenuated phase shift reticle, which employs a molybdenum/silicon (MoSi) layer overlying the chromium radiation blocking layer. A second kind is referred to as an alternating phase shift reticle, which employs etching through areas of the quartz base substrate layer to varying depths. Fabrication of each of these phase shifting reticles may require the use of a wet etch process. As a result, the removal of hard mask residue from the surface of the patterned radiation-blocking layer is necessary, so that this residue will not lift off during the wet etch process, depositing contamination of the surfaces of the reticle structure.

FIGS. 4A through 4E show schematic cross-sectional views of a series of process steps which may be used to remove a hard mask (which may have anti-reflective properties) overlaying a patterned chrome layer on a reticle surface.

Figure 4A:
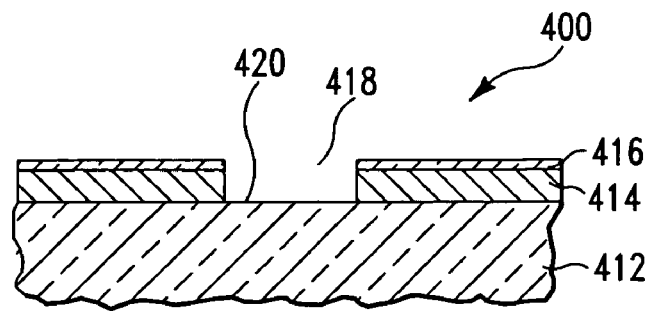
FIGS. 4A through 4E show schematic cross-sectional views of a series of process steps which may be used to remove a hard mask (which may have anti-reflective properties) overlaying a patterned chrome layer on a reticle surface. This procedure may be necessary when a wet etch is to be carried out on a portion of a radiation-blocking layer or underlying quartz layer of a phase shifting reticle.

FIG. 4A shows a schematic cross-sectional view of a reticle substrate 400 including, from bottom to top, a quartz base substrate layer 412, a patterned overlying chrome layer 414 having a thickness of about 750 Å, and a layer of $Si_xO_yN_z$ antireflective coating/hard mask layer 416 having a thickness of about 200 Å to about 300 Å. The patterned opening 418 in the chrome layer 414 continues entirely through chrome layer 414 to the upper surface 420 of quartz base substrate layer 412.

Figure 4B:
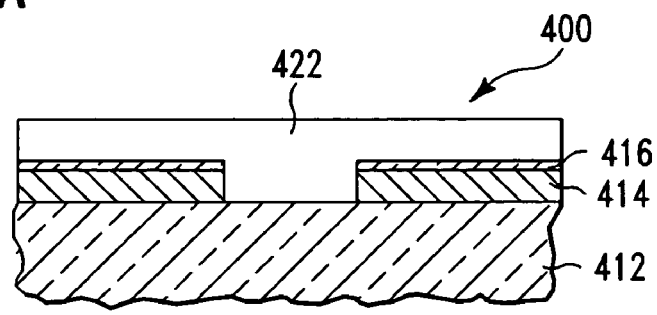
Figure 4C:
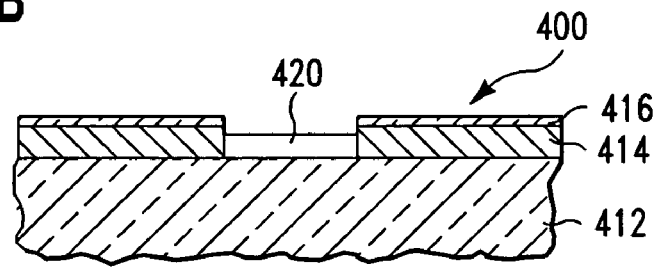

To permit plasma etch removal of the layer of $Si_xO_yN_z$ antireflective coating/hard mask 416 without damage to the surface 420 of quartz base substrate layer 412, it is necessary to apply a protective material 422 over the surface of reticle substrate 412, filling opening 418. This is shown in FIG. 4B. The layer of protective material 422 may be applied by any of the means of applying additive layers during semiconductor processing. However, an preferred method of applying protective material 422 is by spin-on techniques of the kind used for an organic spin-on layer such as a photoresist. The requirements for protective layer 422 are easy and inexpensive application and good selectivity for etch relative to hard masking layer 416 (which in this example, and not by way of limitation, is $Si_xO_yN_z$ antireflective coating/hard mask.) Subsequent to application of protective layer 422, which is preferably an organic material, an etch-back process is carried out to expose the surface of the $Si_xO_yN_z$ antireflective coating/hard mask layer to be removed. This step is shown in FIG. 4C. The etch back process leaves enough organic material covering the quartz base layer 412 to protect this layer during removal of the $Si_xO_yN_z$ antireflective coating/hard mask layer. Typically the etch chemistry for the plasma etch back of the organic material provides for use of a plasma source gas comprising oxygen, nitrogen and hydrogen. Plasma etch processes for etching organic materials such as photoresists using this chemistry are known in the art.

Figure 4D:
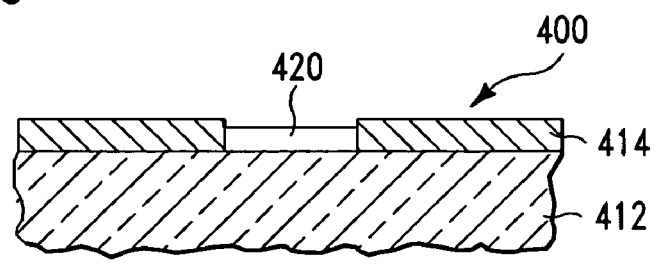
Figure 4E:
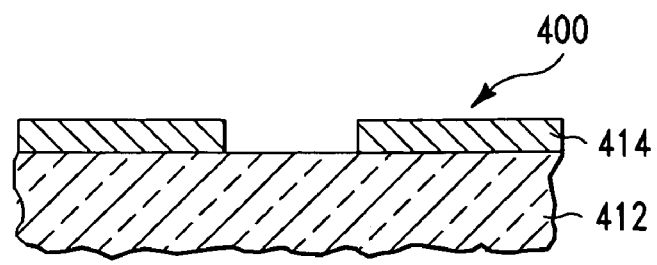

Once the $Si_xO_yN_z$ antireflective coating/hard mask layer has been exposed, as shown in FIG. 4C, this layer is removed using a $CF_4$ and oxygen plasma etch (or other similar fluorine-containing etch known in the art for the removal of silicon oxynitride), to produce the structure shown in FIG. 4D.

In the final step of the process, the spin-on organic material of protective layer 420 is removed either using a plasma etch where the plasma is generated from a source gas comprising a mixture of oxygen, nitrogen and hydrogen, or by using a wet etch solution known in the art for removal of organic material. It is also possible to use an ashing procedure of the kind known in the art for removal of the protective organic material.

The above described exemplary embodiments are not intended to limit the scope of the present invention, as one skilled in the art can, in view of the present disclosure expand such embodiments to correspond with the subject matter of the invention claimed below.

We claim:

1. A method of reducing critical dimension bias during fabrication of a reticle, comprising:
    (a) providing a reticle starting substrate comprising a radiation-transmitting base substrate layer, a radiation-blocking layer overlying said base substrate layer, at least one inorganic hard mask layer overlying said radiation-blocking layer, wherein said at least one hard mask layer exhibits anti-reflective properties capable of substantially reducing reflection of optical radiation off a surface of said radiation-blocking layer, and a chemically amplified photoresist layer overlying said hard masking layer;
    (b) direct writing a latent image into said chemically amplified photoresist layer;
    (c) developing said photoresist containing said latent image into a patterned photoresist;
    (d) transferring a pattern from said photoresist to said at least one inorganic hard mask layer using a plasma etch technique, to provide a patterned inorganic hard mask layer exhibiting anti-reflective properties; and
    (e) transferring said pattern from said at least one patterned inorganic hard mask layer to said radiation-blocking layer using a plasma etch technique, whereby the increase in a critical dimension of said radiation-blocking layer after patterning from said developed photoresist critical dimension is about 7% or less.

2. A method in accordance with claim 1, wherein said at least one inorganic hard mask layer exhibits two layers, where a first hard mask layer which is in contact with said radiation-blocking layer has anti-reflective properties capable of substantially reducing reflection of optical radiation off a surface of said radiation-blocking layer, and a second hard mask layer overlying said first layer does not have such anti-reflective properties.

3. A method in accordance with claim 1, wherein said radiation-transmitting base substrate layer is selected from the group consisting of quartz, borosilicate glass, soda lime glass, and combinations thereof.

4. A method in accordance with claim 2, wherein said radiation-transmitting base substrate layer is selected from the group consisting of quartz, borosilicate glass, soda lime glass, and combinations thereof.

5. A method in accordance with claim 1, wherein said chemically amplified photoresist includes a resin selected from the group consisting of methacrylate-containing polymer, a novolak, a hydroxy-phenyl polymer, an aromatic acrylic polymer, an isobornyl-containing polymer, and combinations thereof.

6. A method in accordance with claim 2, wherein said chemically amplified photoresist includes a resin selected from the group consisting of methacrylate-containing polymer, a novolak, a hydroxy-phenyl polymer, an aromatic acrylic polymer, an isobornyl-containing polymer, and combinations thereof.

7. A method in accordance with claim 1, wherein said pattern is direct written on said photoresist using a continuous wave laser operating at a wavelength ranging from about 198 to about 257 nm.

8. A method in accordance with claim 1 or claim 2, wherein said pattern is direct written on said photoresist using a continuous wave laser operating at a wavelength ranging from about 198 to about 257 nm.

9. A method in accordance with claim 1, wherein said at least one inorganic hard mask exhibits anti-reflective properties and is selected from the group consisting of chrome oxynitride, silicon oxynitride, silicon-rich oxide, silicon-rich nitride, silicon-rich oxynitride, titanium nitride, molybdenum silicide, and silicon carbide, including: SiC; SiC: H; SiC: O, H; SiC: N, H; and SiC: O, N, H.

10. A method in accordance with claim 2, wherein said inorganic hard mask having anti-reflective properties is selected from the group consisting of chrome oxynitride, silicon oxynitride, silicon-rich oxide, silicon-rich nitride, silicon-rich oxy-nitride, titanium nitride, molybdenum silicide, and silicon carbide, including: SiC; SiC: H; SiC: O, H; SiC: N, H; and SiC: O, N, H.

11. A method in accordance with claim 10, wherein said inorganic hard mask having anti-reflective properties is deposited using plasma enhanced chemical vapor deposition.

12. A method in accordance with claim 11, wherein said inorganic hard mask having anti-reflective properties is deposited using plasma enhanced chemical vapor deposition.

13. A method in accordance with claim 2, wherein said second hard mask which does not have anti-reflective properties is selected from the group consisting of diamond-like carbon, silicon oxide, silicon, carbon, tungsten, and $Si_3N_4$.

* * * * *